United States Patent
Jang

(10) Patent No.: US 7,268,089 B2
(45) Date of Patent: *Sep. 11, 2007

(54) METHOD FOR FORMING PE-TEOS LAYER OF SEMICONDUCTOR INTEGRATED CIRCUIT DEVICE

(75) Inventor: Bong-Jun Jang, Osan (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 0 days.

This patent is subject to a terminal disclaimer.

(21) Appl. No.: 10/693,457

(22) Filed: Oct. 27, 2003

(65) Prior Publication Data

US 2004/0106302 A1    Jun. 3, 2004

(30) Foreign Application Priority Data

Dec. 3, 2002   (KR) .................... 10-2002-0076350

(51) Int. Cl.
   *H01L 21/469* (2006.01)
(52) U.S. Cl. .................. 438/778; 438/787; 438/788; 438/905
(58) Field of Classification Search ................ 438/778, 438/787, 788, 789, 790, 902, 905
See application file for complete search history.

(56) References Cited

U.S. PATENT DOCUMENTS 5,970,383 A * 10/1999 Lee .......................... 438/788
6,127,261 A * 10/2000 Ngo et al. .................. 438/633
6,214,751 B1 * 4/2001 Lee .......................... 438/800
6,242,347 B1 * 6/2001 Vasudev et al. ............. 438/680
6,819,969 B2 * 11/2004 Lee et al. ................... 700/121
2002/0192972 A1 * 12/2002 Narita et al. ................ 438/710

FOREIGN PATENT DOCUMENTS

| EP | 0272 140 A2 * | 12/1987 |
|---|---|---|
| JP | 07-302765 | 11/1995 |
| JP | 09-232298 | 9/1997 |
| KR | 1998-0134853 | 1/1998 |
| KR | 1999-0066366 | 8/1999 |

* cited by examiner

Primary Examiner—Michael Trinh
(74) Attorney, Agent, or Firm—Volentine & Whitt, PLLC

(57) ABSTRACT

A method of forming a PE-TEOS layer of a semiconductor IC device provides uniformly thick PE-TEOS layers on a batch of wafers. First, a loading wafer cassette is prepared to provide the wafers to be processed. Next, a process atmosphere is pre-created in a processing chamber. Then the wafers are supplied in sequence into the chamber from the loading wafer cassette and the wafers are mounted on a heater table in the chamber. Next, the PE-TEOS layer is deposited on the wafers by spraying a process gas into the chamber through showerheads. Next, the wafers are discharged from the chamber. Once the chamber is cleared of wafers, the inside of the chamber is cleaned by supplying a cleaning gas into the chamber, and exciting the cleaning gas with RF power. Subsequently, more TEOS gas is supplied into the chamber through the showerheads without being excited by RF power to especially reduce the temperature of the showerheads and that prevailing inside the chamber. In particular, the temperature within the chamber is brought back down to the process temperature.

8 Claims, 5 Drawing Sheets ly, the present invention relates to a method of forming a PE-TEOS layer on a semiconductor wafer.

METHOD FOR FORMING PE-TEOS LAYER OF SEMICONDUCTOR INTEGRATED CIRCUIT DEVICE

BACKGROUND OF THE INVENTION

1. Field of the Invention

The present invention relates generally to the fabrication of semiconductor integrated circuit devices using plasma. More particularly, the present invention relates to a method of forming a PE-TEOS layer on a semiconductor wafer.

2. Description of the Related Art

In the fabrication of semiconductor integrated circuit devices, PE-TEOS (plasma enhanced tetra-ethyl ortho silicate) is widely used for inter-metal dielectric (IMD) layers because the PE-TEOS layer has good step coverage and a high dielectric characteristic. In general, TEOS is a silicon oxide grown by pyrolyzing liquid $Si(OC_2H_5)_4$ under a vacuum. A PE-TEOS layer is a layer of silicon oxide deposited on a wafer by exciting TEOS gas using a radio frequency (RF) power while the gas is at a given temperature and under a given pressure, whereby plasma is formed. This process is thus known as a chemical vapor deposition (CVD) process or, more specifically, a plasma-enhanced chemical vapor deposition (PECVD) process.

A chemical vapor deposition (CVD) apparatus capable of batch processing is typically used to attain high yields for the PE-TEOS process. For example, the Sequel model of Novellus Systems, Inc. allows for six wafers to be processed at a time in a chamber. FIG. 1 schematically shows in plan such a conventional CVD apparatus for use in forming a PE-TEOS layer.

Referring to FIG. 1, the CVD apparatus 10 has a chamber 12 in which the PE-TEOS deposition process is performed. The CVD apparatus 10 further has a heater table 14, which is also referred to as a heater block, and several showerheads 16. The heater table 14 heats the inside of the chamber 12 and thus, the wafers 24 supported in the chamber 12. The showerheads 16 spray process gases, such as TEOS gas, onto the wafers 24 mounted on the heater table 14. In addition, the chamber 12 is equipped with two wafer cassettes 20 and 30. A loading wafer cassette 20 contains the wafers 24 to be supplied into the chamber 12. An unloading wafer cassette 30 receives wafers 24 discharged from the chamber 12 after the PE-TEOS deposition process.

The heater table 14 has a spindle 18 at its center and six wafer stages 17 disposed around the spindle 18. Each wafer stage 17 supports a wafer 24 supplied from the loading wafer cassette 20. The spindle 18 rotates so that the wafers 24 can be loaded from the loading cassette onto the respective wafer stages 17 and unloaded from the wafer stages 17. More specifically, the spindle 18 has a spindle body 13 capable of moving up-and-down and rotating, and pairs of transfer bars 15 connected to the spindle body 13. The transfer bars 15 extend to the wafer stages 17 and can be inserted into grooves formed on the wafer stages 17.

The wafer stages 17 include a first stage 17a located near the loading wafer cassette 20. The second through sixth stages 17b-17f are spaced from the first wafer stage 17a and from one another in the circumferential direction of the spindle body 13, i.e., are spaced from the first stage 17a in the clockwise direction in the figure. The sixth stage 17f is located near the unloading wafer cassette 30. The spindle 18 transfers each wafer 24 from one wafer stage to the next wafer stage in the clockwise direction. For example, in order to transfer the wafer 24 from the first stage 17a to the second stage 17b, the spindle body 13 moves upward so that the transfer bars 15 supporting the wafer 24 are raised above the top surface of the first stage 17a. Then the spindle body 13 rotates to move the transfer bars 15 supporting the wafer over the second stage 17b, whereupon the spindle body 13 moves downward. Therefore, the transfer bars 15 are inserted into the grooves in the second stage 17b, whereby the wafer 24 is mounted on the second stage 17b.

FIG. 2 illustrates a flow 40 of a conventional method for forming the PE-TEOS layer by using the CVD apparatus described above. Referring to FIGS. 1 and 2, the conventional PE-TEOS method begins with a preparation step 41 in which the loading wafer cassette 20 provides the wafers 24 to be subjected to the PE-TEOS deposition process. Next, and before the actual deposition occurs, a process atmosphere is created in the chamber 12 (pre-creating step 42). The atmosphere is the same as the one in which the actual deposition will take place. Such a pre-creating step 42 is also referred as to a pre-coating step.

In a next step 43, the wafers 24 are supplied in sequence into the chamber 12 from the loading wafer cassette 20. The PE-TEOS layer is deposited to a target thickness (PE-TEOS deposition step 44) while the wafers 24 in the chamber 12 are sequentially transferred by the spindle 18 from the first wafer stage 17a to the sixth wafer stage 17f.

In a next step 45, the wafer 26 on which the PE-TEOS layer has been formed to a target thickness is unloaded from the sixth stage 17f of the chamber 12 to the unloading wafer cassette 30. The PE-TEOS deposition (step 44) and the wafer unloading (step 45) are carried out continuously without interruption until an RF cleaning process (step 47) starts. More specifically, the PE-TEOS layer is deposited during the PE-TEOS deposition step 44 not only on the wafer(s) 24 but also on exposed portions of the inside of the chamber 12, namely, on inner walls of the chamber 12 and surfaces of the heater table 14. Therefore, the thickness of the PE-TEOS layer deposited on the exposed portions of the chamber 12 should be periodically checked and, if the thickness thereof exceeds a specific thickness, the inside of the chamber 12 should be cleaned. However, whether the cleaning process (step 47) can begin depends on the target thickness of the PE-TEOS layer. For example, if the target thickness is approximately 17000 Å, the RF cleaning step 47 can only be initiated once a PE-TEOS layer having the target thickness of approximately 17000 Å is formed on all twenty-five wafers 24 in the loading wafer cassette 20.

The RF cleaning step 47 is initiated after the PE-TEOS deposition step 44 once all of the wafers 26 are unloaded from the chamber 12. Then, oxygen gas and $C_2F_6$ gas are supplied together into the chamber 12 while excited by the RF power under a pressure of about 3 Torr and a temperature of about 390° C. The RF cleaning removes foreign particles as well as the PE-TEOS layer deposited on the exposed portions of the chamber 12. After the RF cleaning step 47, the CVD apparatus prepares for next PE-TEOS batch deposition process, i.e., the method returns to preparation step 41.

Unfortunately, the above-described conventional process for forming the PE-TEOS layer has drawbacks. As shown in FIG. 3, the thickness of the PE-TEOS layers deposited on the wafers decreases gradually and then becomes almost uniform after the RF cleaning process has been performed. For example, when the PE-TEOS layer has a target thickness of about 17000 Å, the thickness of the PE-TEOS layers formed on the first twelve wafers becomes smaller and smaller, and thereafter the thickness of the PE-TEOS layers formed on the following wafers is substantially uniform.

The thickness of the PTEOS layer becomes smaller in the first several wafers that are processed after the RF cleaning step because the shower heads and the inside of the chamber are heated during the cleaning step by the heater table 14 on which no wafers are mounted. Accordingly, the temperature of the shower heads and the inside of the chamber rises above the deposition process temperature, and this rise in temperature affects the deposition thickness of the PE-TEOS layer.

Under this condition, the PE-TEOS layers are formed on the wafers initially supplied into the chamber 12 to a thickness that is greater than the target thickness. On the other hand, as more and more wafers are supplied into the chamber 12, the heat produced by the heater table 12 is absorbed by the wafers. In addition, the TEOS gas sprayed through the showerheads reduces the temperature of the showerheads and the inside of the chamber. Therefore, the internal temperature of the chamber is eventually stabilized at about the desired process temperature whereupon the thickness of the PE-TEOS layers formed on the wafers becomes uniform.

When the PE-TEOS layers have different thicknesses for the reasons explained above, it is difficult to establish a suitable depth to which the PE-TEOS layers should be polished in a subsequent process. Furthermore, different thicknesses of the PE-TEOS layers cause serious differences to occur among the critical dimension of respective patterns subsequently formed on the wafers. It would therefore be desirable to prevent the temperature of the showerheads and the inside of the chamber from being excessively heated by the empty heater table. However, it is difficult to control the temperature of the heater table, and thereby control the temperature of the showerheads and the inside of the chamber.

SUMMARY OF THE INVENTION

It is therefore one object of the present invention to provide a plasma process by which each of a plurality of substrates can be processed uniformly, even after the inside of a processing chamber of a plasma processing apparatus has been cleaned by a process that heats the chamber.

It is a more specific object of the present invention to provide a method of forming PE-TEOS layers having a uniform thickness on each of a batch of wafers, even after the inside of a processing chamber of a PECVD apparatus has been cleaned.

According to one aspect of the present invention, the temperature of the showerheads and the inside of the chamber of a PECVD apparatus is reduced to that of the process temperature immediately after the inside of the processing chamber of the CVD processing apparatus is cleaned.

In a preferred embodiment of the present invention, a method of forming a PE-TEOS layer begins by providing a plurality of wafers to be batch processed using a loading wafer cassette containing the wafers. A process atmosphere is then created or "pre-created" in the processing chamber before any actual deposition takes place on the wafers. The process atmosphere may by pre-created by heating the heater table to a temperature of about 350° C., spraying the TEOS gas through the showerheads, and forming plasma in the chamber at a pressure of about 2 Torr using an RF power input of about 300W to 700W. The atmosphere is the same as one in which PE-TEOS layer will be formed on the wafers.

Next, the wafers are supplied in sequence (one by one) from the loading wafer cassette and onto a heater table in the processing chamber. A PE-TEOS layer is formed on the wafers by spraying a process gas, including TEOS, into the chamber through showerheads and onto the wafers disposed on the heating table, and exciting the process gas using RF power.

The inside of the chamber is cleaned once all of the wafers in the chamber have been discharged from the chamber, as required. The cleaning of the inside of the chamber may be performed by supplying oxygen gas and $C_2F_6$ gas together into the chamber, and exciting the gas with the RF power at a pressure of about 3 Torr and a temperature of about 390° C.

After the chamber has been cleaned, and before any more wafers are loaded into the chamber, TEOS gas is supplied into the chamber through the showerheads without exciting the TEOS gas with RF power. The TEOS gas reduces the temperature of the showerheads and that prevailing inside the chamber. To this end, about 1 µl to 20 kl of TEOS gas may be sprayed into the chamber for one second to two hours and maintained at a pressure of about 20 Torr or less. Preferably, the TEOS gas is sprayed at a flow rate of about 2.1 ml/min for about 250 seconds with RF power down and is maintained at a pressure of about 2 Torr.

DETAILED DESCRIPTION OF THE PREFERRED EMBODIMENTS

Figure 1:
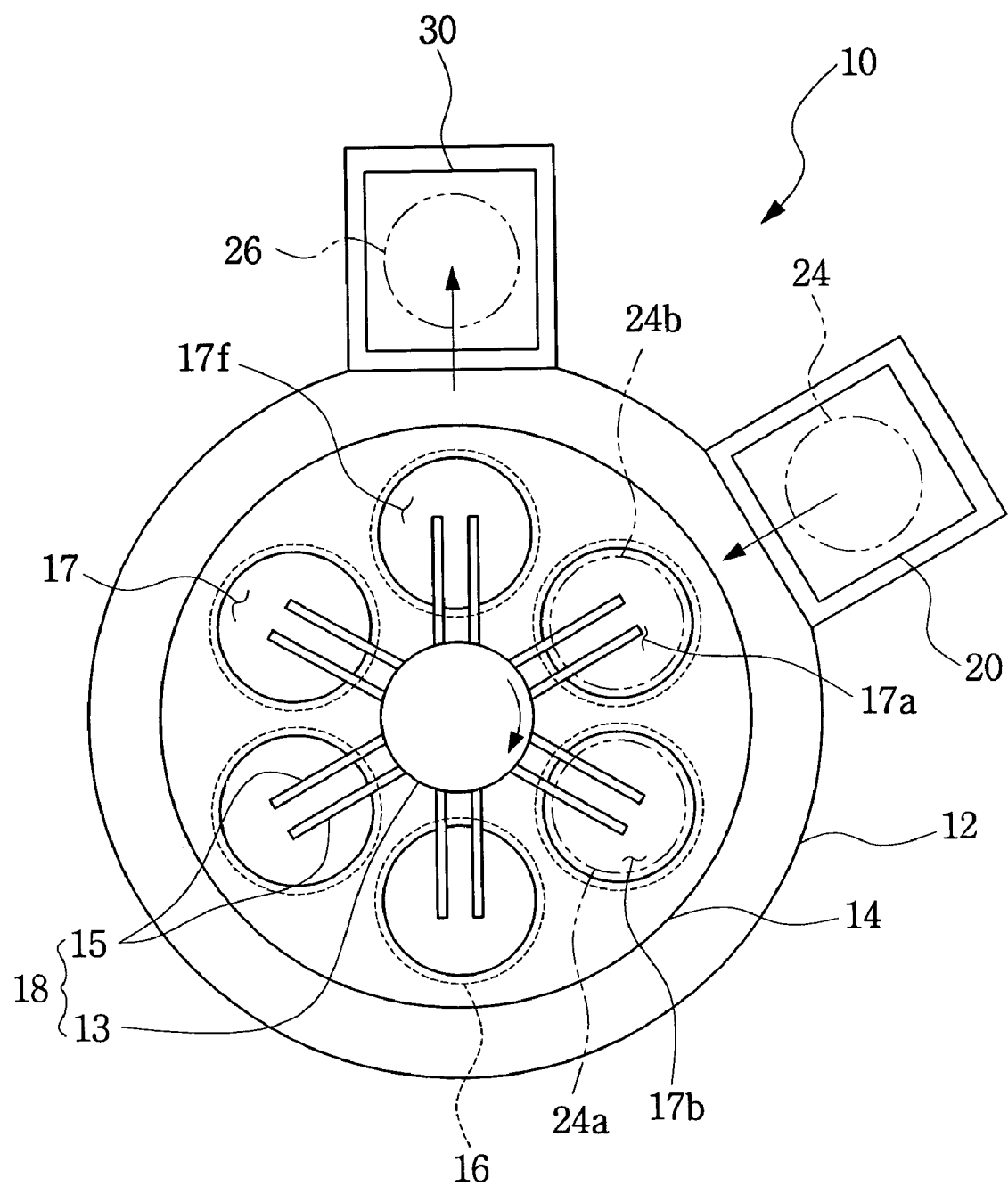
FIG. 1 is a schematic plan view of a conventional CVD apparatus used for forming a PE-TEOS layer.
Figure 2:
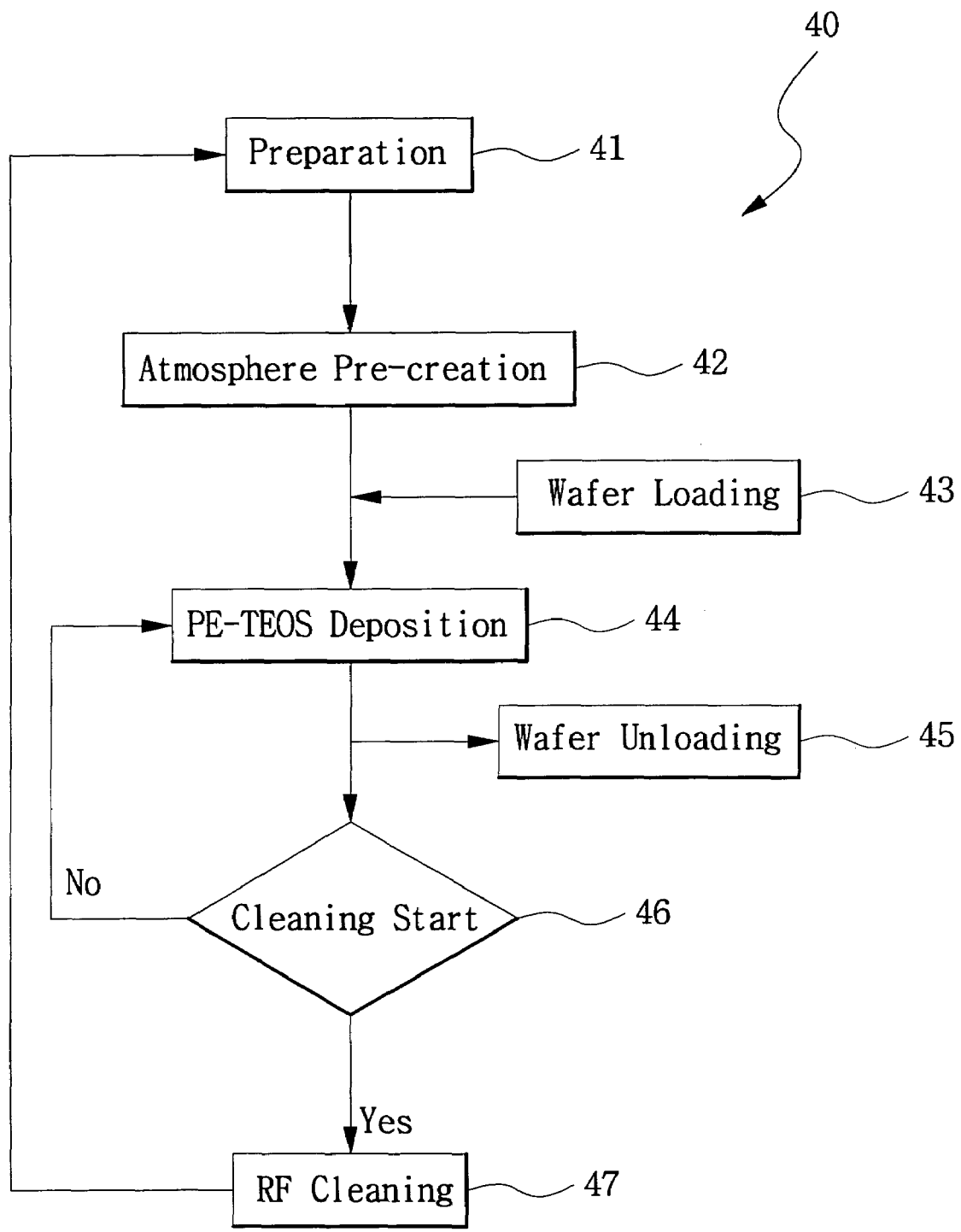
FIG. 2 is a flow chart of a conventional method for forming a PE-TEOS layer.
Figure 3:
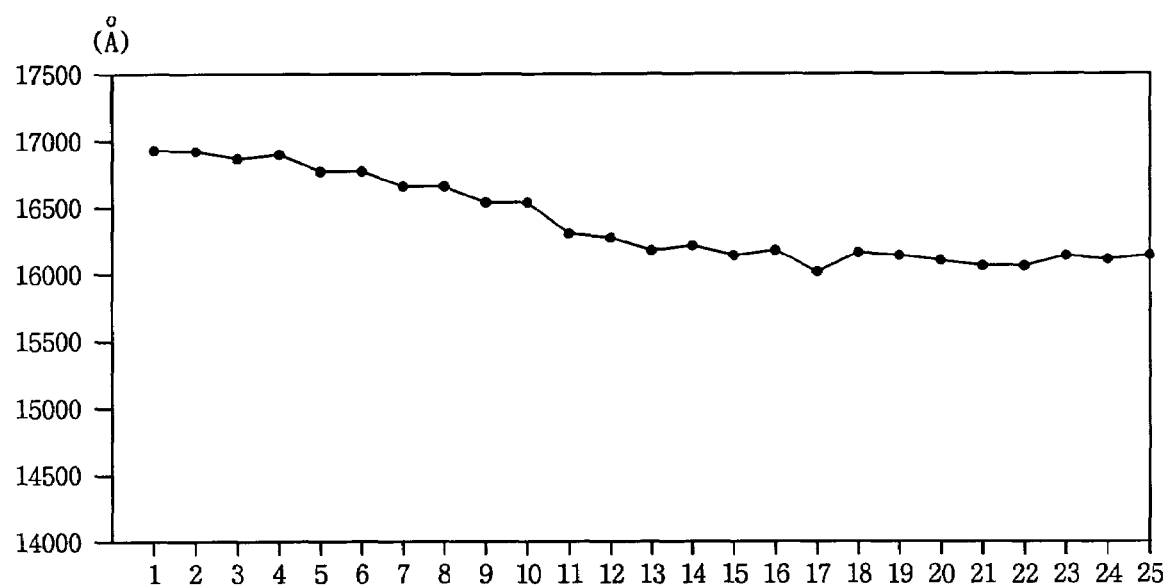
FIG. 3 is a graph showing the thicknesses of the PE-TEOS layers formed on twenty-five wafers according to the conventional method shown in FIG. 2.

The present invention will now be described more fully hereinafter with reference to FIGS. 1, 4 and 5.

Figure 4:
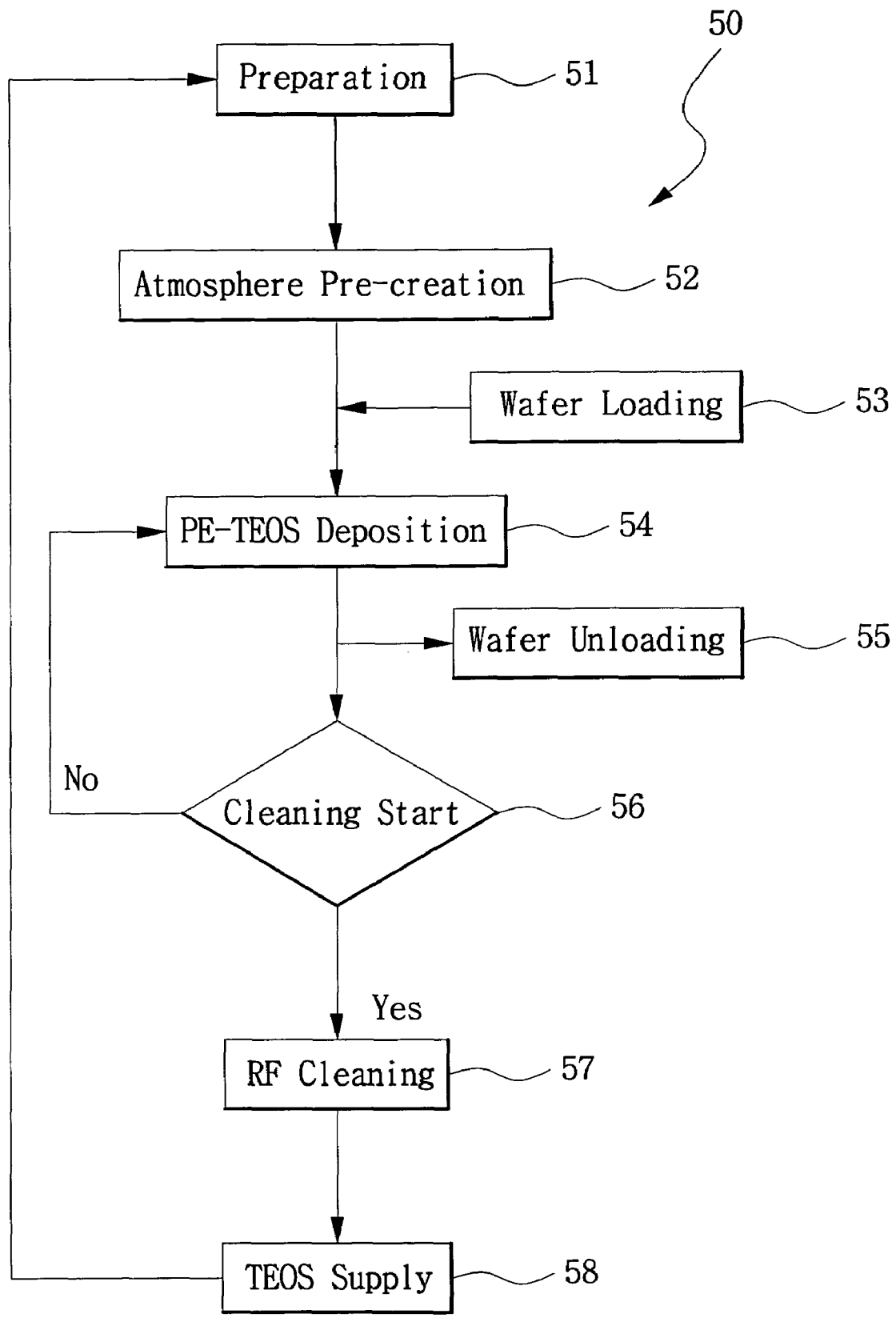
FIG. 4 is a flow chart of a method for forming a PE-TEOS layer of a semiconductor IC device in accordance with the present invention.

FIG. 4 shows the flow 50 of a method for forming a PE-TEOS layer of a semiconductor integrated circuit (IC) device in accordance with the present invention. The method shown in FIG. 4 uses the CVD apparatus shown in FIG. 1. Referring to FIGS. 1 and 4, the PE-TEOS forming method begins at a preparation step 51 in which the loading wafer cassette 20 provides several wafers 24, for example, twenty-five wafers, to be supplied in sequence into the chamber 12 and subjected to PE-TEOS deposition.

Next, a step 52 of creating a process atmosphere in the chamber 12 is performed before the actual deposition takes place. The pre-created atmosphere is the same as the one in which actual deposition takes place, though. More specifically, TEOS gas is sprayed through the showerheads 16 into the chamber 12 while the pressure in the chamber is maintained at about 2 Torr, and plasma is produced in the chamber 12 by providing an RF power of about 300W to about 700W. Also, at this time, the heater table 14 is heated to a temperature of about 350° C.

In a next step 53, the wafers 24 are supplied in sequence into the chamber 12 from the loading wafer cassette 20. The PE-TEOS layer is deposited to a target thickness during a PE-TEOS deposition step 54 while the wafers 24 in the chamber 12 are sequentially transferred by the spindle 18 from the first wafer stage 17a to the sixth wafer stage 17f. That is, the PE-TEOS layer of one-sixth the target thickness is deposited on a wafer at each wafer stage.

In particular, the first wafer 24a supplied into the chamber 12 is mounted on the first wafer stage 17a and a first portion of the PE-TEOS layer is deposited on the first wafer 24a on the first wafer stage 17a. The first wafer 24a is then transferred to the second wafer stage 17b by the rotation of the spindle 18. At the same time, the second wafer 24b is supplied into the chamber 12 and mounted on the first wafer stage 17a. Then a first portion of the PE-TEOS layer is deposited on the second wafer 24b, and a second portion of the PE-TEOS layer is deposited on the first wafer 24a. FIG. 1 shows a state in which the first and second wafers are present in the chamber 12.

The steps of supplying a wafer into the chamber 12, transferring the wafers from stage to stage, and depositing PE-TEOS on each wafer supported on a stage are automatically and repeatedly performed. Therefore, each wafer 26 undergoes six deposition processes whereupon the thickness of the PTEOS layer deposited thereon reaches the target thickness. In a next step 55, the wafer 26 is unloaded from the sixth stage 17f to the unloading wafer cassette 30. The RF cleaning (step 57) starts only once all of the wafers 26 have been unloaded.

The RF cleaning step 57 removes by-products produced during the PE-TEOS deposition step 54, for example, a PE-TEOS layer deposited on exposed portions of the inside of the chamber 12. The determination of when to start the cleaning process (step 56) depends on the target thickness of the PE-TEOS layer. For example, if the target thickness is approximately 17000 Å, the RF cleaning (step 57) starts after the PE-TEOS layer has been formed on all twenty-five wafers 24 provided by the loading wafer cassette 20. Alternatively, the cleaning process may be established to begin once the thickness of the PE-TEOS layer deposited on the exposed inside portions of the chamber 12 reaches about 10 μm. Furthermore, an alarm may be set to go off before this condition occurs, e.g., when the thickness of the PE-TEOS layer deposited on the exposed inside portions of the chamber 12 reaches about 8 μm.

In any case, the RF cleaning (step 57) begins once the wafers 26 have been discharged from the chamber 12. Then, oxygen and $C_2F_6$ are supplied together into the chamber 12, and the RF power is supplied thereto while the gases are at a pressure of about 3 Torr and a temperature of about 390° C.

After the RF cleaning (step 57) takes place, TEOS gas is specially supplied into the chamber 12 (step 58). This step 58 of introducing the TEOS gas into the chamber is performed to reduce the temperature of the showerheads and that prevailing inside the chamber 12 to the process temperature. The supplying of the TEOS gas in step 58 is performed with the RF off and at a pressure of about 20 Torr or less. In addition, about 1 μl to 20 kl of the TEOS gas is sprayed into the chamber 12. Preferably, the TEOS gas is sprayed for one second to two hours, and more preferably at a flow rate of about 2.1 ml/min for about 250 seconds with the RF power off and at a pressure of about 2 Torr.

At this time, i.e., in step 58, the PE-TEOS is not deposited anywhere within the chamber 12 because the TEOS gas is supplied without the RF power being supplied thereto. On the other hand, the supplied TEOS gas provides a process atmosphere similar to that of the actual deposition process, and thereby keeps the temperature of the showerheads 16 and that inside the chamber 12 at the process temperature. After step 58, the flow 50 of the method returns to the preparation step 51, i.e., the CVD apparatus is readied for next batch PE-TEOS deposition process.

Figure 5:
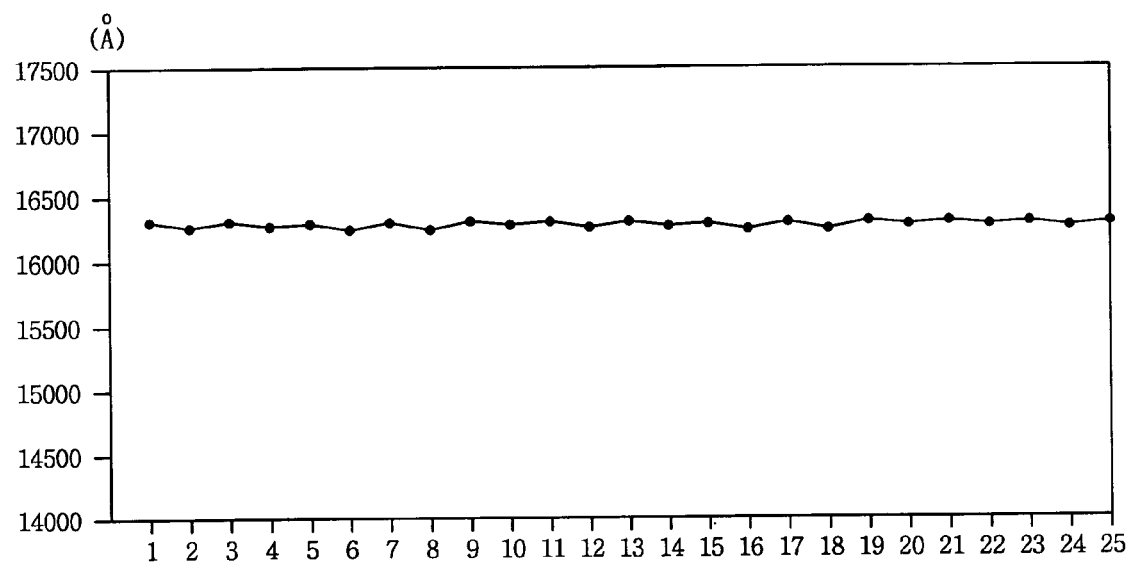
FIG. 5 is a graph showing the thicknesses of the PE-TEOS layers formed on twenty-five wafers according to the method shown in FIG. 4.

FIG. 5 is a graph showing the results of the present invention, i.e., when the method for forming a PE-TEOS layer includes supplying TEOS gas after the inside of the process chamber is RF cleaned. As can be seen from FIG. 5, PE-TEOS layers having a uniform thickness are formed on all of the twenty-five wafers. The exemplary thickness shown in the graph of FIG. 5 is approximately 16300 Å.

Finally, it is to be noted that the preferred embodiments of the invention have been disclosed in the drawings and specification. However, these preferred embodiments can obviously be changed or modified within the true spirit and scope of the invention as set forth in the following claims.

What is claimed is:

1. A plasma-enhanced method of processing each of a plurality of substrates, said method comprising:
   pre-creating a process atmosphere in a processing chamber of a plasma processing apparatus, the atmosphere being the same as one in which the substrates will be processed;
   subsequently supplying the substrates in sequence into the chamber;
   processing a batch of the substrates, said processing comprising spraying a process gas into the chamber and towards substrates disposed in the chamber, and exciting the process gas using RF power to convert the process gas into plasma, whereby the plasma is deposited on the substrates and a portion of the plasma processing apparatus within said chamber;
   discharging the batch of substrates from the chamber;
   cleaning the inside of the chamber once all of the wafers in the chamber have been unloaded from the chamber to remove deposits from said portion of the plasma processing apparatus, said cleaning comprising using a cleaning gas which is different than the process gas and heating the chamber; and
   after the chamber has been cleaned, and before any more substrates are loaded into the chamber, supplying the process gas into the chamber without exciting the process gas with RF power so as to reduce the temperature prevailing inside the chamber without converting the process gas into plasma,
   wherein the substrates are processed at a given deposition temperature within the chamber, and wherein the process gas is supplied into the chamber, without exciting the process gas with RF power, for a sufficient time so as to reduce the temperature prevailing inside the chamber to the deposition temperature.

2. The method of claim 1, wherein said spraying a process gas into the chamber and onto the substrates disposed in the chamber comprises spraying the process gas through a shower head, and said supplying a gas into the chamber comprises spraying gas into the chamber through said showerhead.

3. The method of claim 1, wherein the process gas comprises TEOS gas.

4. The method of claim 1, wherein the cleaning of the inside of the chamber is performed by supplying the cleaning gas into the chamber, and exciting the cleaning gas using RF power to convert the cleaning gas to plasma.

5. The method of claim 4, wherein the cleaning gas comprises oxygen gas and $C_2F_6$ gas.

6. The method of claim 3, wherein the cleaning of the inside of the chamber is performed by supplying the cleaning gas into the chamber, and exciting the cleaning gas using RF power to convert the cleaning gas to plasma.

7. The method of claim 4, wherein the cleaning gas comprises oxygen gas and $C_2F_6$ gas.

8. The method of claim 1, and further comprising subsequently processing another batch of substrates in the chamber.

* * * * *